(12) United States Patent
Arora et al.

(10) Patent No.: US 10,070,537 B2
(45) Date of Patent: Sep. 4, 2018

(54) FORMATION OF DIELECTRIC WITH SMOOTH SURFACE

(71) Applicant: INTEL CORPORATION, Santa Clara, CA (US)

(72) Inventors: Deepak Arora, Chandler, AZ (US);
Daniel N. Sobieski, Phoenix, AZ (US);
Dilan Seneviratne, Chandler, AZ (US);
Ebrahim Andideh, Tempe, AZ (US);
James C. Meyer, Tualatin, OR (US)

(73) Assignee: INTEL CORPORATION, Santa Clara, CA (US)

( * ) Notice: Subject to any disclaimer, the term of this patent is extended or adjusted under 35 U.S.C. 154(b) by 138 days.

(21) Appl. No.: 15/065,620

(22) Filed: Mar. 9, 2016

(65) Prior Publication Data

US 2016/0192508 A1 Jun. 30, 2016

Related U.S. Application Data

(62) Division of application No. 13/906,229, filed on May 30, 2013, now abandoned.

(51) Int. Cl.
| | |
|---|---|
| *B32B 38/10* | (2006.01) |
| *H05K 3/46* | (2006.01) |
| *C23C 14/22* | (2006.01) |
| *H05K 3/42* | (2006.01) |
| *H05K 3/10* | (2006.01) |

(Continued)

(52) U.S. Cl.
CPC ......... *H05K 3/4644* (2013.01); *C23C 14/228* (2013.01); *H05K 3/0035* (2013.01); *H05K 3/0055* (2013.01); *H05K 3/42* (2013.01); *B32B 38/10* (2013.01); *B32B 43/006* (2013.01); *H01L 21/44* (2013.01); *H01L 21/48* (2013.01); *H01L 21/565* (2013.01); *H05K 3/0014* (2013.01); *H05K 3/0044* (2013.01); *H05K 3/107* (2013.01); *H05K 3/281* (2013.01); *H05K 2203/0554* (2013.01); *H05K 2203/1105* (2013.01); *H05K 2203/1152* (2013.01); *Y10T 156/1168* (2015.01); *Y10T 156/1978* (2015.01)

(58) Field of Classification Search
CPC . B32B 38/10; B32B 43/006; Y10T 156/1168; Y10T 156/1978; H05K 3/0014; H05K 3/0044; H05K 3/0055; H05K 3/107; H05K 3/2891; H05K 2203/1105; H05K 2203/1152; H01L 21/44; H01L 21/48; H01L 21/565
USPC .................................................. 156/714, 764
See application file for complete search history.

(56) References Cited

U.S. PATENT DOCUMENTS

| | | | |
|---|---|---|---|
| 8,729,397 B2 | 5/2014 | Liu et al. | |
| 2004/0124566 A1* | 7/2004 | Sreenivasan | B81C 1/0046 264/494 |

(Continued)

*Primary Examiner* — Mark A Osele
*Assistant Examiner* — Nickolas Harm
(74) *Attorney, Agent, or Firm* — Schwabe, Williamson & Wyatt, P.C.

(57) ABSTRACT

Embodiments of the present disclosure are directed towards techniques and configurations for formation of a dielectric with a smooth surface. In one embodiment, a method includes providing a dielectric with first and second surfaces, a conductive feature formed on the first surface, and a laminate applied to the second surface, curing the second surface while the laminate remains applied, and removing the laminate. Other embodiments may be described and/or claimed.

20 Claims, 7 Drawing Sheets

(51) Int. Cl.

| | |
|---|---|
| H01L 21/48 | (2006.01) |
| B32B 43/00 | (2006.01) |
| H01L 21/44 | (2006.01) |
| H05K 3/00 | (2006.01) |
| H05K 3/28 | (2006.01) |
| H01L 21/56 | (2006.01) |

(56) References Cited

U.S. PATENT DOCUMENTS

| | | |
|---|---|---|
| 2004/0237295 A1 | 12/2004 | Wakizaka et al. |
| 2005/0260790 A1* | 11/2005 | Goodner ............. H01L 21/4846 438/106 |
| 2007/0013049 A1* | 1/2007 | Asai ..................... H01L 23/145 257/700 |
| 2007/0278693 A1* | 12/2007 | Lehr ................. H01L 21/76808 257/774 |
| 2008/0212102 A1* | 9/2008 | Nuzzo ................. G01N 21/554 356/445 |
| 2009/0166682 A1* | 7/2009 | Scheuerlein ........... B82Y 10/00 257/211 |
| 2009/0288870 A1 | 11/2009 | Kondo et al. |
| 2012/0153501 A1* | 6/2012 | Murai ..................... H01L 23/14 257/774 |
| 2012/0160551 A1 | 6/2012 | Liu et al. |
| 2012/0313207 A1* | 12/2012 | Oganesian ............. H01L 24/19 257/433 |
| 2013/0062108 A1 | 3/2013 | Kondo |

* cited by examiner

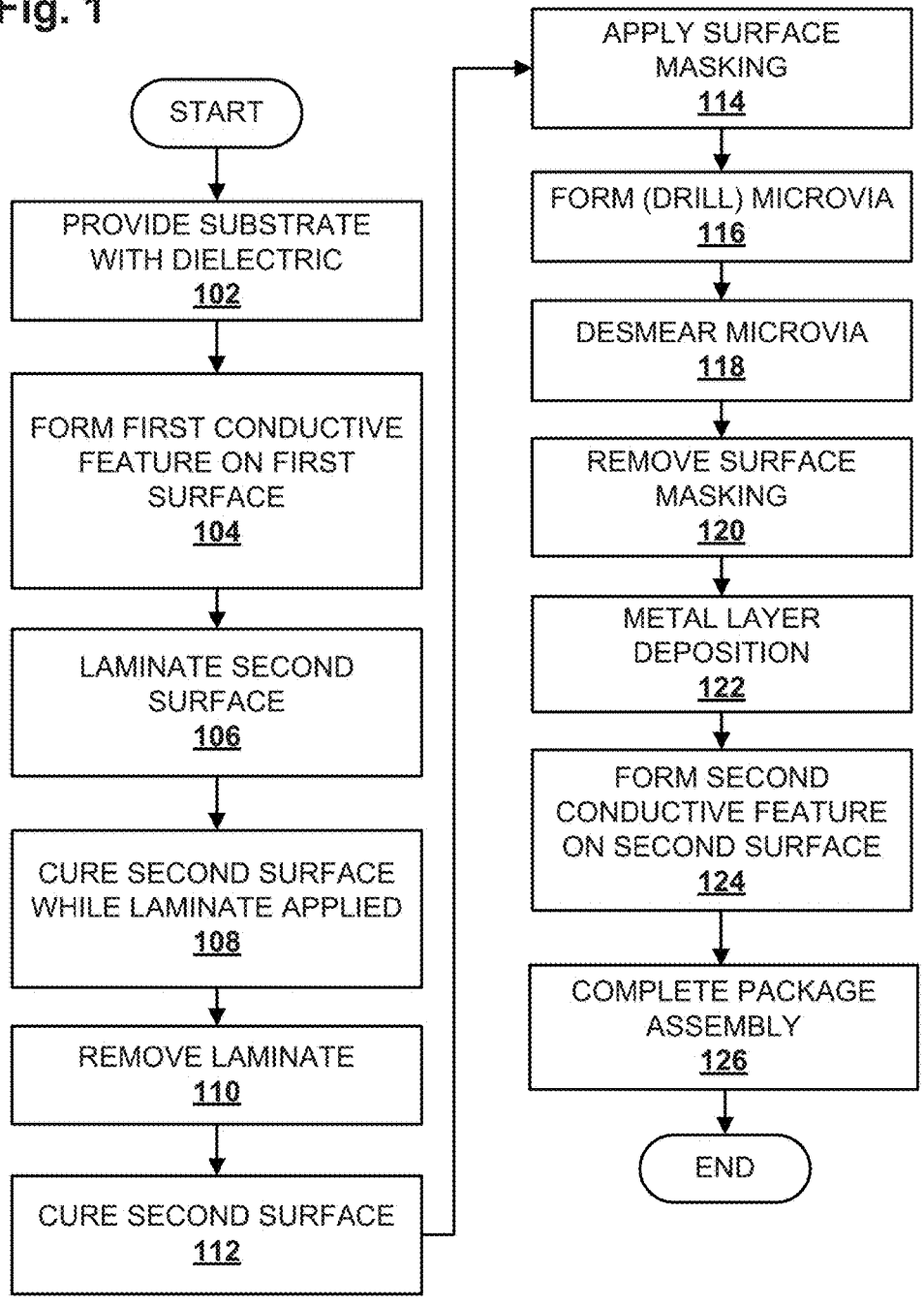

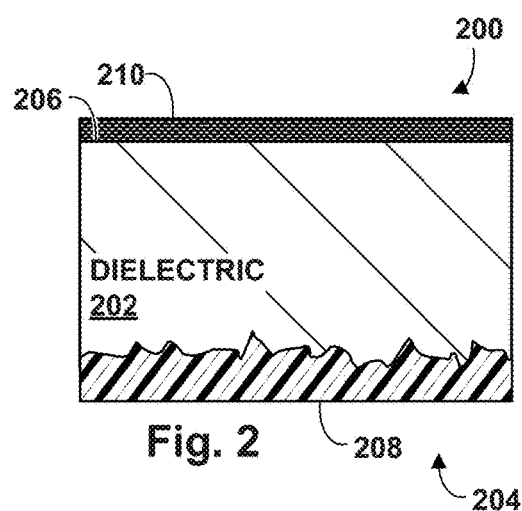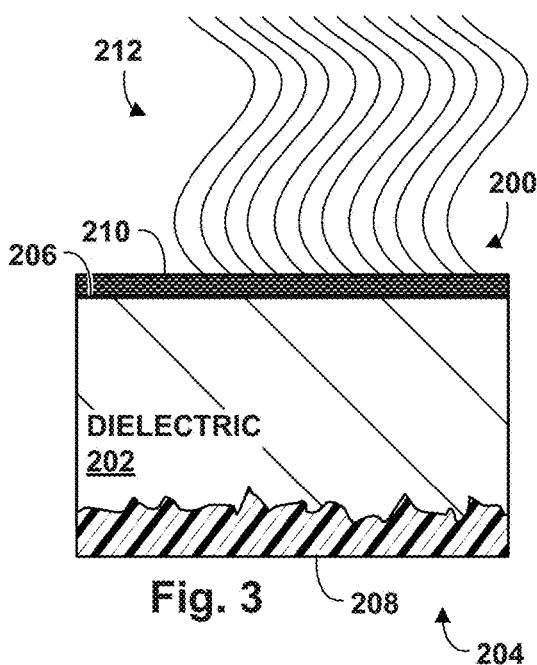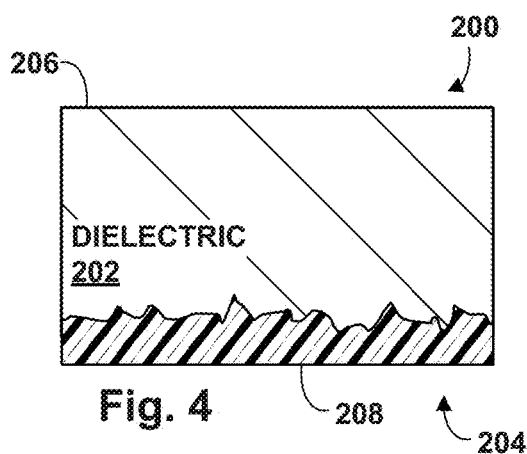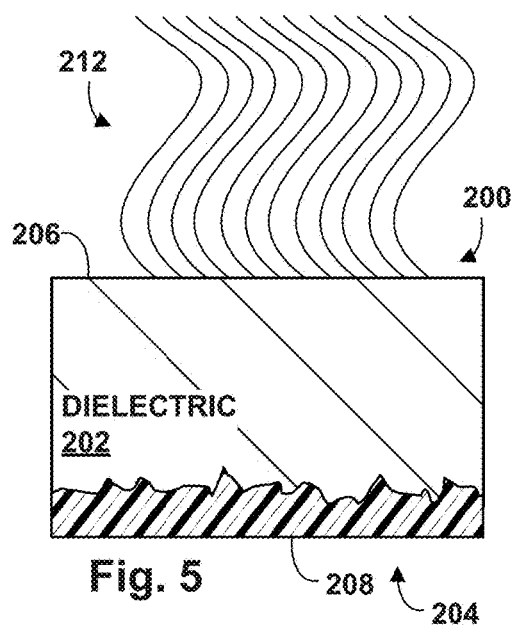

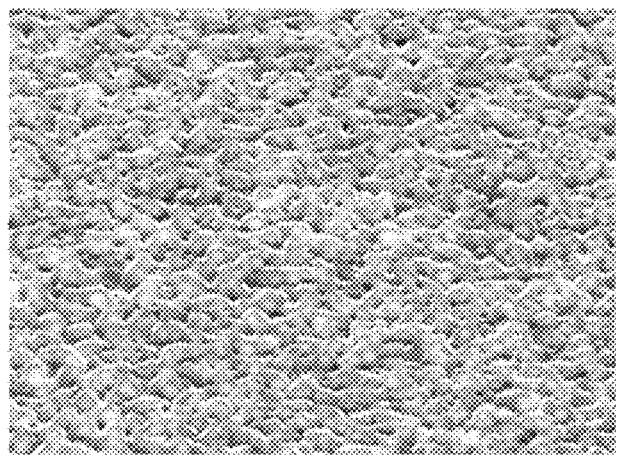
Fig. 12
Fig. 13
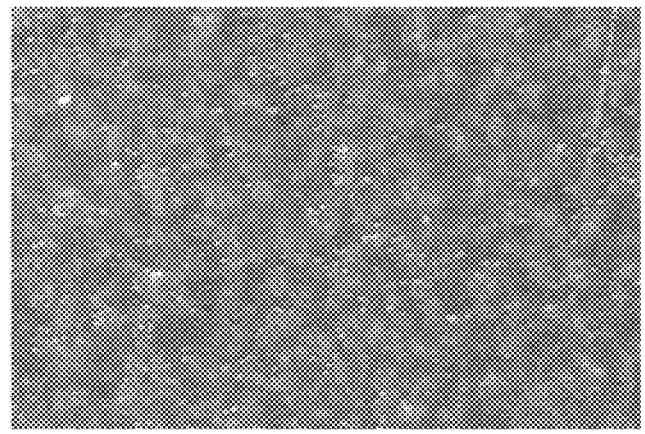
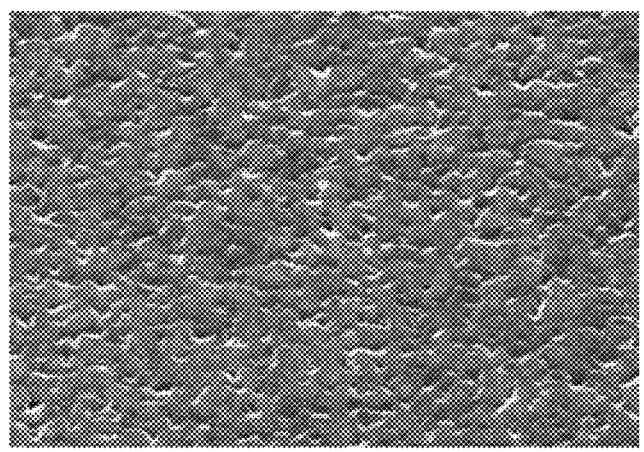
Fig. 14

FORMATION OF DIELECTRIC WITH SMOOTH SURFACE

CROSS REFERENCE TO RELATED APPLICATIONS

This application is a divisional application of U.S. patent application Ser. No. 13/906,229, entitled FORMATION OF DIELECTRIC WITH SMOOTH SURFACE, filed May 30, 2013, and claims priority to the U.S. patent application Ser. No. 13/906,229, the contents of which is herein incorporated by reference in its entirety.

FIELD

Embodiments of the present disclosure generally relate to the field of integrated circuits, and more particularly, to techniques and configurations for formation of a dielectric with a smooth surface.

BACKGROUND

A dielectric may be coated using various deposition processes. In an electroless process, the dielectric may be coated using a controlled autocatalytic (self-continuing) reduction, e.g., by subjecting the dielectric to a reducing chemical bath of various materials with metal, such as copper, nickel, silver, gold, palladium, or others. Adhesion of an electroless-deposited material to a dielectric surface may be primarily mechanical. Consequently, electroless deposition may be most effective when the dielectric surface is relatively rough, e.g., with critically needed placed anchor points. However, to reduce electrical losses, it is desirable to reduce the dielectric-metal interface roughness.

In a physical vapor deposition ("PVD") process, a desired film material such as titanium may be vaporized and deposited onto a dielectric surface inside of a vacuum. In some PVD processes, the vapor may be applied to the dielectric surface as condensation. In other PVD processes known as "sputtering," the desired film material (sometimes referred to as the "target material") may be bombarded by energetic particles. This causes atoms to be ejected from the target material and projected onto the dielectric surface to form a thin coating. In contrast to electroless deposition, PVD deposition, particularly sputtering, works best on a relatively smooth dielectric surface.

Dielectric surface smoothness is governed largely by the curing process, which is performed after a thin film such as a laminate is removed from the dielectric surface. Heating ramp rate, maximum temperature and cure time may all be tailored to achieve a desired smoothness. However, the level of smoothness that may be achieved using these curing variables is limited. Moreover, downstream processes such as chemical desmearing (e.g., to evacuate a drilled opening or "via") may increase average surface roughness ($R_a$) of exposed dielectric surfaces, e.g., from 140 nanometers ("nm") to greater than 350 nm.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIG. 1 schematically illustrates a flow diagram for a method of fabricating an package substrate, in accordance with some embodiments.

FIGS. 2-11 schematically illustrate cross-sectional side views of an example package substrate at various stages of fabrication, in accordance with various embodiments.

FIG. 12 depicts an example dielectric surface after undergoing a prior art fabrication process.

FIGS. 13 and 14 depict example dielectric surfaces after undergoing fabrication as described herein, in accordance with various embodiments.

DETAILED DESCRIPTION

Figure 6:
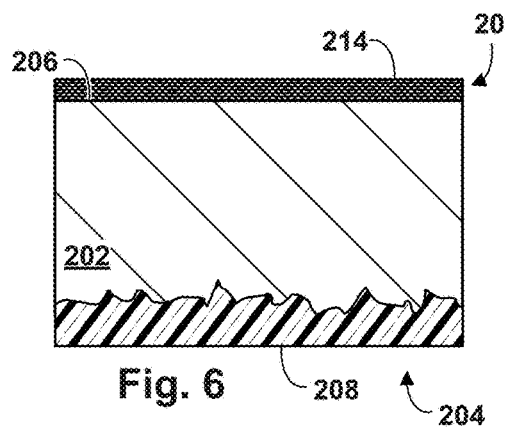

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit ("ASIC"), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 depicts a process 100 for fabricating an integrated circuit ("IC") package substrate that may be used in a package assembly. FIGS. 2-11 schematically illustrate cross-sectional side views of an IC package substrate 200 (hereinafter, "package substrate 200") at various stages of the fabrication process depicted in FIG. 1. The operations of process 100 will be described with reference to package substrate 200 of FIGS. 2-11.

At operation 102, a substrate 202 with dielectric (hereafter referred to simply as "dielectric") having a first surface 204 and a second surface 206 may be provided. In some embodiments, such as that shown in FIGS. 2-11, first surface 204 and second surface 206 are disposed oppositely from one another, but this is not required in various embodiments. In various embodiments, dielectric 202 may be composed of various materials including organic materials or polymers. For example, in some embodiments, dielectric 202 may be an epoxy-based laminate substrate having a core and/or build-up layers such as, for example, an Ajinomoto Build-up Film ("ABF"). Additionally or alternatively, dielectric 202 may include organic material or polymer with silicon dioxide particle filler (e.g., with different concentrations and particle sizes) material, such as ABF films. In some cases, dielectric may include silica particles with diameters from 20 nanometers to 5 micrometers, and/or concentration between 5% and 70%.

In various embodiments, at operation 104, a first conductive feature 208 may be formed on first surface 204. In various embodiments, first conductive feature 208 may include a roughened copper (Cu) layer, as shown in FIGS. 2-11. In other embodiments, other conductive features, such as other electrical routing features, may be formed on first surface 204.

At operation 106, a laminate 210 may be applied to second surface 206 of dielectric 202. In some embodiments, laminate 210 may be polyethylene terephthalate ("PET") or another suitable material. After operations 102-106, package substrate 200 may appear as shown in FIG. 2.

At operation 108, second surface 206 may be cured, e.g., using heat 212 as shown in FIG. 3, while laminate 210 remains applied to second surface 206. In various embodiments, various parameters of heat 212, including but not limited to heating ramp rate, maximum temperature and cure time, may be adjusted to achieve various characteristics. As noted in the background, these parameters might affect the smoothness of second surface 206. However, with laminate 210 applied during cure as shown in FIG. 3, second surface 206 may be less affected by these parameters.

Instead, smoothness of second surface 206 may be shaped by a bottom surface of laminate 210. In particular, during the cure, a negative imprint of the bottom surface of laminate 210, which may be very smooth, may be formed on second surface 206. In some embodiments, second surface 206 (and/or other surfaces of dielectric 202) may have a resulting surface roughness between 40 nanometers ("nm") and 75 nm. In various embodiments, surface roughness may be an average roughness, $R_a$, calculated using the following equation:

$$R_a = \frac{1}{n}\sum_{i=1}^{n} |y_i|$$

In various embodiments, n may be a positive integer that represents a number of surface samples measured. In various embodiments, y may be a distance of a sample from a mean line of the surface.

In some embodiments, at operation 110, laminate 210 may be removed from second surface 206 after the cure at operation 108, as depicted in FIG. 4. For example, laminate 210 may be removed using an adhesive tape or any equipment that uses adhesive tape, such as an auto peeler. At operation 112, second surface may be cured again, as depicted in FIG. 5. Because second surface 206 of dielectric 202 was already cured at operation 108, it may already be highly cross-linked (e.g., more than 90%). Consequently, second surface 206 may be less affected by the second cure. In various embodiments, the second cure, when performed in an oxygen-rich environment, may provide additional oxidation of second surface 206. This may create additional affinity of second surface 206 to receive adhesion metal, e.g., using sputtering as discussed below.

Figure 7:
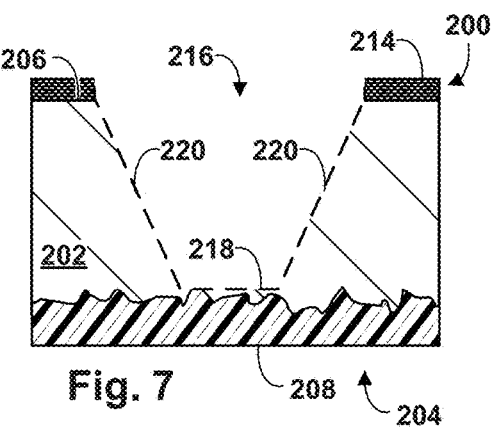

At operation 114, surface masking 214 (e.g., in the form of a metal hardmask such as titanium) may be applied to second surface 206, as depicted in FIG. 6. At operation 116, an opening (hereinafter "via 216") (e.g., a micro-via) may be formed, e.g., drilled using a laser (not shown), through surface masking 214 and dielectric 202, as depicted in FIG. 7. Typically, residue and debris 218 would remain in via 216 from the drilling at operation 114. This residue and/or debris may interfere with electrical interlayer connection that occurs through via 216.

Figure 8:
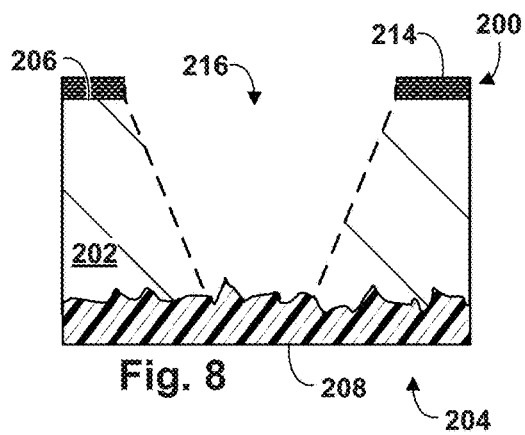

Accordingly, at operation 118, debris 218 may be removed from via 216 in a process called desmearing. Desmearing may be performed using various techniques. In some embodiments, desmearing may be performed using chemicals, the formulations of which are not material for this disclosure. As a side effect, these chemicals may cause exposed surfaces of dielectric 202 to become roughened. FIG. 8 depicts package substrate 200 after desmearing.

Figure 9:
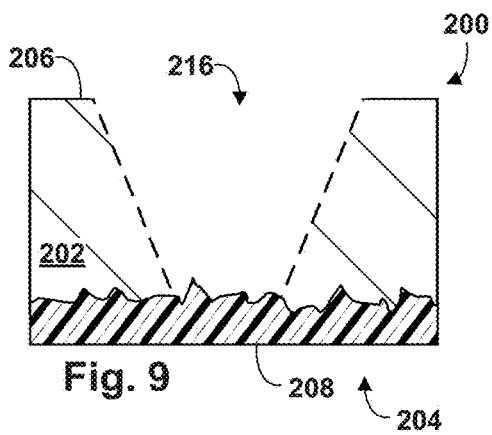

Because portions of second surface 206 that remain after drilling are covered in surface masking 214, these surface portions will not be affected by the desmearing process, and therefore may remain relatively smooth. After debris 218 is removed, at operation 120, surface masking 214 may be removed, e.g., using etching. FIG. 9 depicts package substrate 200 after removal of surface masking 214.

Figure 10:
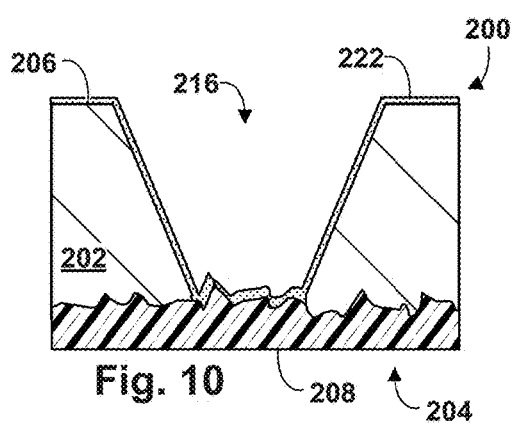

At operation 122, a metal layer 222, which may serve as a seed layer, may be deposited on package substrate 200, as shown in FIG. 10. This seed layer may be used for subsequent semi-additive interconnect formation through patterning and electroplating. In some embodiments, metal layer 222 may be deposited onto second surface 206 and exposed surfaces in the via 216 using a physical vapor deposition ("PVD") or evaporation processes. For instance, sputtering may be used to cause atoms from a target material (e.g., titanium, copper) to be projected onto second surface 206 to form a thin coating. As noted in the background, sputtering may work best on a relatively smooth dielectric surface, such as second surface 206.

Figure 11:
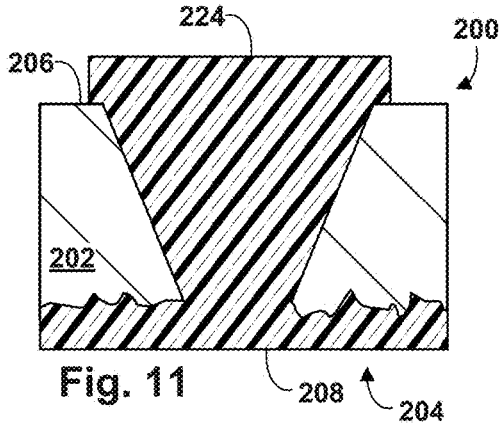

After operation 122, various operations may be performed to form complete package substrate 200 to various stages of fabrication. For example, at operation 124, a second conductive feature 224 may be formed on second surface 206 and fill the via 216. In some embodiments, second conductive feature 224 may be formed on second surface 206 using, e.g., a semi-additive process ("SAP"). In other embodiments, second conductive feature 224 may be formed on second surface 206 using a subtractive process. In various embodiments, second conductive feature 224 may be electrically coupled with first conductive feature 208, e.g., through via 216. This process may also form traces on the aforementioned dielectric. FIG. 11 depicts package substrate 200 after operation 124. At operation 126, package substrate 200 may be completed, e.g., by added various components and electrical paths that need not be discussed here. For example, second conductive feature 224 may be electrically coupled with various other components, such as one or more die.

Various operations are described as multiple discrete operations in turn, in a manner that is most helpful in understanding the claimed subject matter. However, the order of description should not be construed as to imply that these operations are necessarily order dependent. Moreover, some operations may be added or omitted.

For example, in some embodiments, operations 110-114 may not be performed at all. Rather than removing laminate 210 at operation 110 and applying surface masking 214 at operation 114, laminate 210 may be left on second surface 206 during the first cure at operation 108. In some such instances, the second cure at operation 112 may be omitted. Thus, when the via is drilled at operation 116, the via may be drilled through laminate 210 and dielectric 202, rather than through surface masking 214 and dielectric 202. Omitting the addition and removal of surface masking 214 at operations 114 and 120 may reduce the number of operations required, thus reducing the overall throughput time (e.g., by more than 30%), and may decrease the cost of process 100. In some cases, laser drill power may be increased when drilling via 216, without risk to second surface 206, which is protected by laminate 210, and the shot quantities may be reduced.

FIGS. 12-14 demonstrate various levels of dielectric layer smoothness that may be achieved using other techniques and techniques described herein. FIG. 12 is a magnified view of an example dielectric surface created using other techniques, e.g., by curing the dielectric after removal of a laminate. It has a resulting surface roughness Ra of approximately 140 nm.

FIG. 13 is a magnified view of another dielectric surface that was cured (e.g., at operation 108) prior to removal of the laminate (e.g., laminate 210). It has a resulting surface roughness Ra of approximately 45 nm. In some cases, a dielectric surface cured in this manner may have a peel strength of 0.754±0.005 kgf/cm. FIG. 14 is a magnified view of yet another dielectric surface that was cured both a first time (e.g., at operation 108) and a second time (e.g., at operation 112). It has a resulting surface roughness $R_a$ of approximately 73 nm. In some cases, a dielectric surface cured in this manner may have a peel strength of 0.785±0.004 kgf/cm.

Unlike the surfaces shown in FIGS. 13 and 14, mechanically-ground dielectric surfaces may exhibit various undesirable characteristics. For example, mechanical grinding may result in dielectric particles (e.g., filler) being dislodged from the surface. In addition, spaces of the surface formerly occupied by those dislodged dielectric particles may be filled with sputtered seed particles.

Figure 15:
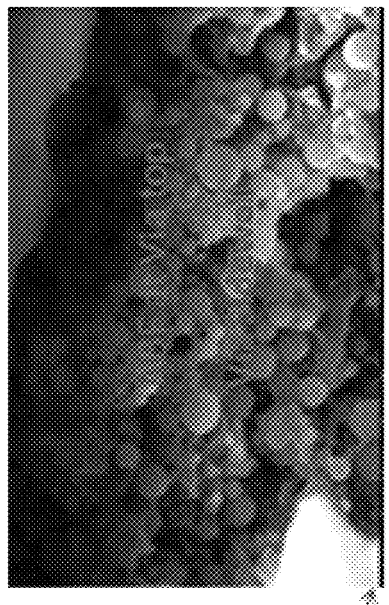
FIGS. 15-17 depict an opening or "via" in a dielectric surface at different stages of fabrication, in accordance with various embodiments.
Figure 16:
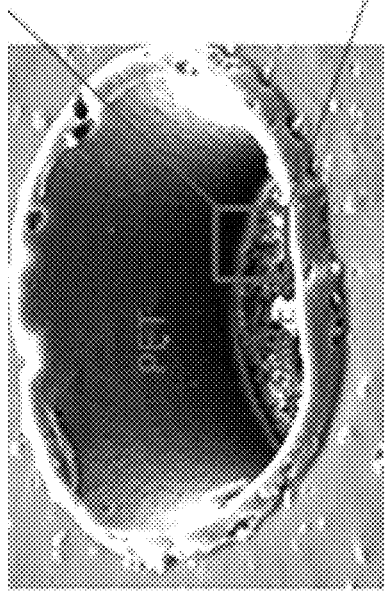
Figure 17:
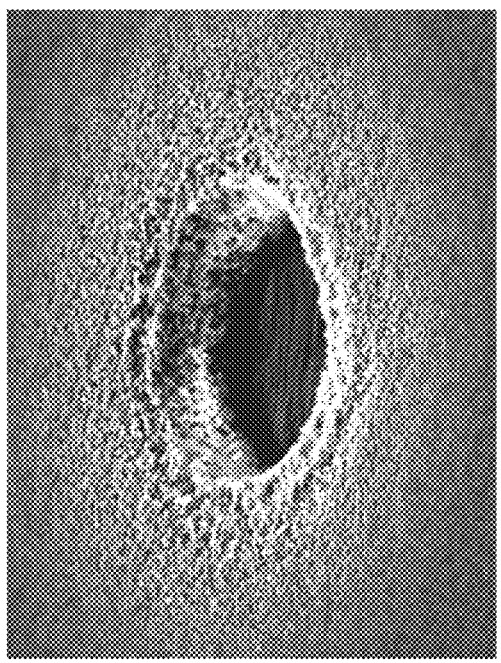

FIGS. 15-17 are images captured of a dielectric surface of a package substrate at various stages of fabrication using disclosed techniques. In FIGS. 15-17, a via can be seen drilled into the dielectric surface. In FIGS. 15 and 16, the surface and via have undergone desmearing (e.g., at operation 118 of FIG. 1), but a PET laminate has not yet been removed. In FIG. 17, the PET laminate has been removed. Some surface roughening may be observed in FIG. 17 on the dielectric surface near the perimeter of the via. This may be caused in some cases by desmear chemicals seeping under the laminate and removing organic components of the dielectric. In various embodiments, this surface roughening may be reduced by increasing an adhesion strength of the PET and/or by altering parameters used during drilling of the via (e.g., amount of power used, number of pulses, etc.).

Figure 18:
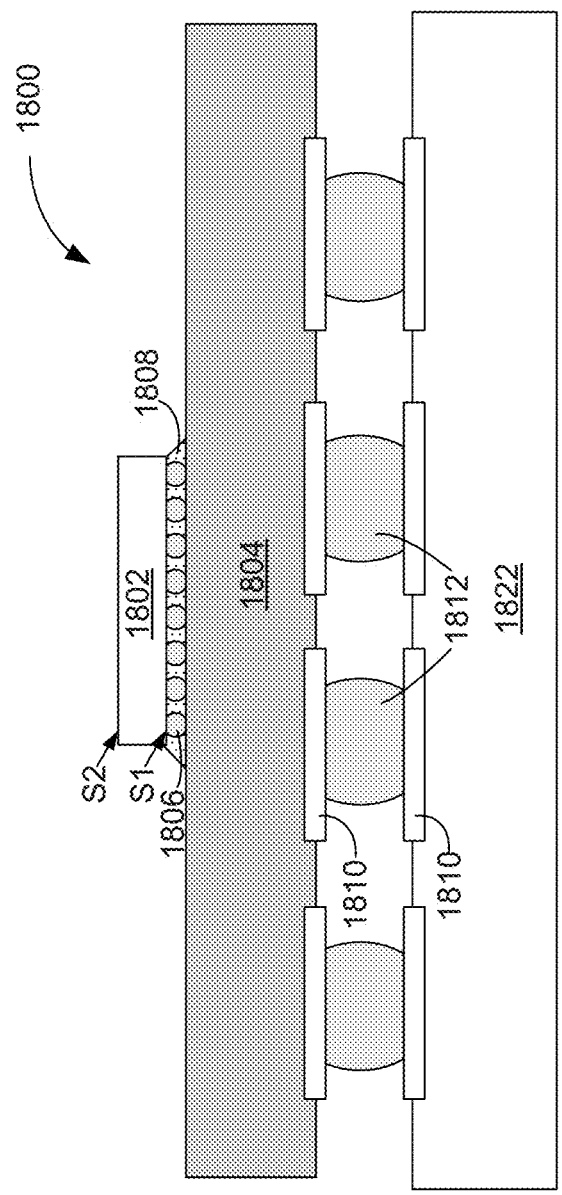
FIG. 18 depicts schematically illustrates a cross-section side view of an example package substrate, in accordance with some embodiments.

FIG. 18 schematically illustrates a cross-section side view of another example integrated circuit (IC) package assembly 1800 formed in accordance with some embodiments. In some embodiments, IC package assembly 1800 may include a die 1802. IC package assembly 1800 may further include a package substrate 1804 (e.g., which could be similar to package substrate 200 of FIGS. 2-11) electrically coupled with die 1802, as can be seen. Package substrate 1804 may further be electrically coupled with a circuit board 1822, as can be seen. IC package assembly 1800 may include other suitable configurations in other embodiments.

Die 1802 may be attached to the package substrate 1804 according to a variety of suitable configurations including, a flip-chip configuration, as depicted, or other configurations such as, for example, being embedded in the package substrate 1804 or being configured in a wirebonding arrangement. In the flip-chip configuration, an active side (e.g., side S1) of the die 1802 is attached to a surface of the package substrate 1804 using die interconnect structures 1806 such as bumps, pillars, or other suitable structures that may also electrically couple the die 1802 with the package substrate 1804. The active side of the die 1802 may include a plurality of IC devices such as, for example, transistor devices that are configured to generate heat when in operation.

The die 1802 may represent a discrete chip made from a semiconductor material and may be, include, or be a part of a processor, memory, or ASIC in some embodiments. In some embodiments, an electrically insulative material such as, for example, molding compound or underfill material 1808 may partially encapsulate a portion of the die 1802 and/or interconnect structures 1806.

Die interconnect structures 1806 may be configured to route electrical signals between die 1802 and package substrate 1804. In some embodiments, the electrical signals may include, for example, input/output (I/O) signals and/or power or ground signals associated with the operation of die 1802.

Package substrate 1804 may include electrical routing features configured to route electrical signals to or from die 1802. The electrical routing features may include, for example, traces (not shown) formed on one or more surfaces of package substrate 1804 and/or internal routing features such as, for example, trenches, vias or other interconnect structures (not shown) to route electrical signals through package substrate 1804. For example, in some embodiments, package substrate 1804 may include electrical routing features such as die bond pads (not shown) configured to receive die interconnect structures 1806 and route electrical signals between die 1802 and package substrate 1804.

In some embodiments, package substrate 1804 may be an epoxy-based laminate substrate having a core and/or build-up layers such as, for example, an ABF substrate. Package substrate 1804 may include other suitable types of substrates in other embodiments including, for example, substrates formed from glass, ceramic, or semiconductor materials.

Circuit board 1822 may be a printed circuit board ("PCB") composed of an electrically insulative material such as an epoxy laminate. For example, circuit board 1822 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Structures (not shown) such as traces, trenches, vias may be formed through the electrically insulating layers to route the electrical signals of die 1802 through circuit board 1822. Circuit board 1822 may be composed of other suitable materials in other embodiments. In some embodiments, circuit board 1822 is a motherboard (e.g., motherboard 1902 of FIG. 19).

Package level interconnects such as, for example, solder balls 1812 may be coupled to one or more pads (hereinafter "pads 1810") on package substrate 1804 and/or on circuit board 1822 to form corresponding solder joints that are configured to further route the electrical signals to between package substrate 1804 and circuit board 1822. Pads 1810 may be composed of any suitable electrically conductive material such as metal including, for example, nickel (Ni), palladium (Pd), gold (Au), silver (Ag), copper (Cu), and combinations thereof. Other suitable techniques to physically and/or electrically couple package substrate 1804 with circuit board 1822 may be used in other embodiments.

Figure 19:
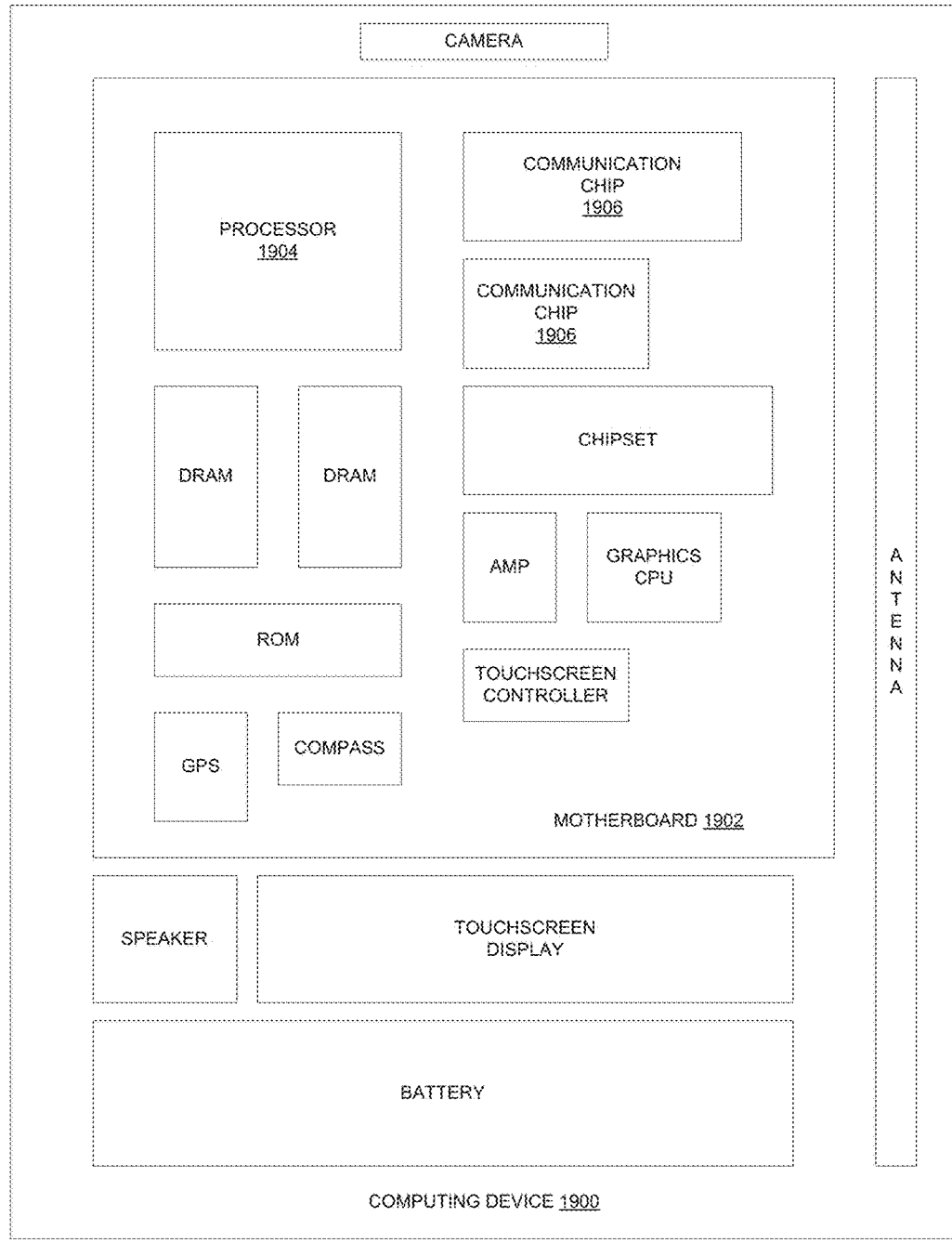
FIG. 19 schematically illustrates a computing device that includes an package substrate with a smooth dielectric surface, in accordance with some embodiments.

Embodiments of the present disclosure may be implemented into a system using any suitable hardware and/or software to configure as desired. FIG. 19 schematically illustrates a computing device 1900 that includes an IC package assembly (e.g., IC package assembly 1800 of FIG. 18) that may include a package substrate (e.g., 200 of FIGS. 2-11) formed using techniques described herein, in accordance with some embodiments. The computing device 1900 may house a PCB such as motherboard 1902. The motherboard 1902 may include a number of components, including but not limited to a processor 1904 and at least one communication chip 1906. The processor 1904 may be physically and electrically coupled to the motherboard 1902. In some implementations, the at least one communication chip 1906 may also be physically and electrically coupled to the motherboard 1902. In further implementations, the communication chip 1906 may be part of the processor 1904. In further implementations, the at least one communication chip 1906 and processor may be coupled without the use of motherboard 1902.

Depending on its applications, computing device 1900 may include other components that may or may not be physically and electrically coupled to the motherboard 1902. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 1906 may enable wireless communications for the transfer of data to and from the computing device 1900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1906 may implement any of a number of wireless standards or protocols, including but not limited to Institute for Electrical and Electronic Engineers (IEEE) standards including Wi-Fi (IEEE 1902.11 family), IEEE 1902.16 standards (e.g., IEEE 1902.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 1902.16 compatible BWA networks are generally referred to as WiMAX networks, an acronym that stands for Worldwide Interoperability for Microwave Access, which is a certification mark for products that pass conformity and interoperability tests for the IEEE 1902.16 standards. The communication chip 1906 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1906 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1906 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1906 may operate in accordance with other wireless protocols in other embodiments.

The computing device 1900 may include a plurality of communication chips 1906. For instance, a first communication chip 1906 may be dedicated to shorter range wireless communications such as Wi-Fi and Bluetooth and a second communication chip 1906 may be dedicated to longer range wireless communications such as GPS, EDGE, GPRS, CDMA, WiMAX, LTE, Ev-DO, and others.

The processor 1904 of the computing device 1900 may include an IC package assembly, which may include a package substrate 200 formed as described herein. For example, the processor 1904 may be coupled with a package substrate (e.g., 1804 in FIG. 18) that is coupled with a circuit board such as the motherboard 1902 (or 1822 in FIG. 19). The package substrate or the motherboard 1902 may include a dielectric of package substrate 200 that is processed according to techniques described herein. The term "processor" may refer to any device or portion of a device that processes electronic data from registers and/or memory to transform that electronic data into other electronic data that may be stored in registers and/or memory.

The communication chip 1906 may also include an IC package assembly (e.g., including package substrate 200 formed using techniques described herein). For example, the communication chip 1906 may be coupled with a package substrate (e.g., 1804 in FIG. 18) or circuit board (e.g., 1822 in FIG. 18) similarly as described in connection with the processor 1904. In further implementations, another component (e.g., memory device or other integrated circuit device) housed within the computing device 1900 may include an IC package assembly (e.g., including package substrate 200 formed using techniques described herein). For example, the other component may be coupled with a package substrate or circuit board similarly as described in connection with the processor 1904.

In various implementations, the computing device 1900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1900 may be any other electronic device that processes data.

EXAMPLES

According to various embodiments, the present disclosure describes a method for forming a dielectric with a smooth surface, comprising providing a dielectric with first and second surfaces, a conductive feature formed on the first surface, and a laminate applied to the second surface, curing the second surface while the laminate remains applied, and removing the laminate. In some embodiments, the method further includes depositing a metal layer onto the second surface using a physical vapor deposition (PVD) process. In some embodiments, the PVD process includes sputtering or evaporation and the metal layer comprises a seed layer.

In some embodiments, the method further includes forming a via from the second surface through the dielectric to the conductive feature and chemically desmearing the via. In some embodiments, the drilling and desmearing are performed while the laminate remains applied to the second surface. In some embodiments, the method further includes applying a surface masking layer to the second surface after the laminate is removed. In some embodiments, the drilling and desmearing are performed while the surface masking layer remains applied to the second surface.

In some embodiments, the method further includes curing the second surface again after the laminate is removed. In some embodiments, the conductive feature is a first conductive feature, and the method further includes forming a second conductive feature by depositing an electrically conductive material to fill the via, the second conductive feature being electrically coupled with the first conductive feature. In some embodiments, the second conductive feature is formed using an additive process. In some embodiments, the second conductive feature is formed using a subtractive process. In some embodiments, the present disclosure describes a product formed by the method described herein.

According to various embodiments, the present disclosure describes a package substrate comprising a dielectric having a first surface and a second surface disposed opposite to the first surface, a conductive feature formed on the first surface, a via that extends from the second surface through the dielectric to the conductive feature, wherein the second surface has a surface roughness between 40 nanometers and 75 nanometers, the second surface is shaped at least in part by a surface of a previously-applied laminate, and the dielectric includes a polymer.

In some embodiments, the conductive feature is a first conductive feature, the via is filled with conductive material, and the package substrate further comprises a second conductive feature formed on the second surface and coupled with the first conductive feature. In some embodiments, the dielectric comprises an epoxy-based Ajinomoto build-up film ("ABF"). In some embodiments, the surface roughness is an average roughness, $R_a$, calculated using the following equation:

$$R_a = \frac{1}{n}\sum_{i=1}^{n}|y_i|$$

wherein n is a positive integer that represents a number of surface samples measured, and y is a distance of a sample from a mean line of the surface.

According to various embodiments, the present disclosure describes a system (e.g., computing device) comprising A system comprising a die and a package substrate coupled to the die and comprising a dielectric having a first surface, and a second surface disposed opposite to the first surface, a first conductive feature formed on the first surface, a second conductive feature formed on the second surface and a via filled with conductive material that extends from the second conductive feature through the dielectric to the first conductive feature. In some embodiments, the second surface has a surface roughness between 40 nanometers and 75 nanometers, shaped at least in part by a surface of a previously-applied laminate. In some embodiments, the system further includes a touch screen display coupled with the die and the package substrate. In some embodiments, the system is a mobile electronic device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include an apparatus or system having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A method, comprising:
   providing a dielectric with first and second surfaces, a conductive feature formed on the first surface, and a laminate applied to the second surface;
   curing the second surface while the laminate remains applied, wherein the second surface of dielectric forms a negative imprint of a surface of the laminate that contacts the dielectric in response to the curing, wherein the surface of the laminate applied to the second surface of the dielectric is smooth, and wherein the second surface of the dielectric has a surface roughness of less than 75 nanometers in response to a first time of the curing; and
   removing the laminate.

2. The method of claim 1, further comprising depositing a metal layer onto the second surface using a physical vapor deposition (PVD) process.

3. The method of claim 2, wherein:
   the PVD process includes sputtering or evaporation; and
   the metal layer comprises a seed layer.

4. The method of claim 1, further comprising:
   forming a via from the second surface through the dielectric to the conductive feature; and
   chemically desmearing the via.

5. The method of claim 4, wherein the forming the via and desmearing the via are performed while the laminate remains applied to the second surface.

6. The method of claim 4, further comprising applying a surface masking layer to the second surface after the laminate is removed.

7. The method of claim 6, wherein forming the via and desmearing the via are performed while the surface masking layer remains applied to the second surface.

8. The method of claim 1, further comprising curing the second surface again after the laminate is removed.

9. The method of claim 1, wherein the conductive feature is a first conductive feature, the method further comprising forming a second conductive feature by depositing an electrically conductive material to fill the via, the second conductive feature being electrically coupled with the first conductive feature.

10. The method of claim 9, wherein the second conductive feature is formed using an additive process.

11. The method of claim 9, wherein the second conductive feature is formed using a subtractive process.

12. A method for surface formation of a dielectric, comprising:
   applying a laminate to a surface of the dielectric;
   curing, a first time, the surface of the dielectric with the applied laminate, wherein the surface of dielectric forms a negative imprint of a surface of the laminate that contacts the dielectric in response to the curing, wherein the surface of the laminate applied to the surface of the dielectric is smooth, and wherein the surface of the dielectric has a surface roughness of less than 75 nanometers in response to the first time of the curing;
   removing the laminate from the surface of the dielectric after completion of the first time of curing; and
   curing, a subsequent time, the surface of the dielectric without the laminate applied to the surface.

13. The method of claim 12, wherein removing the laminate includes utilization of an adhesive tape to remove the laminate.

14. The method of claim 12, wherein curing, the first time, includes adjusting a cure time to achieve a desired smoothness of the surface of the dielectric.

15. The method of claim 12, wherein the method further comprises electrically coupling the dielectric to a die.

16. The method of claim 12, wherein the method further comprises electrically coupling the dielectric to a circuit board.

17. The method of claim 12, wherein curing, the first time, includes application of heat to the surface of the dielectric.

18. A method for surface formation of a dielectric, comprising:
   applying a laminate to a surface of the dielectric;
   curing, a first time, the surface of the dielectric with the applied laminate, wherein the surface of dielectric forms a negative imprint of a surface of the laminate that contacts the dielectric in response to the curing, wherein curing, the first time, includes adjusting a heating ramp rate to achieve a desired smoothness of the surface of the dielectric;
   removing the laminate from the surface of the dielectric after completion of the first time of curing; and
   curing, a subsequent time, the surface of the dielectric without the laminate applied to the surface.

19. The method of claim 18, wherein the surface of the laminate applied to the surface of the dielectric is smooth, and wherein the surface of the dielectric has a surface roughness of less than 75 nanometers in response to the first time of the curing.

20. The method of claim 18, wherein curing, the first time, includes adjusting a cure time to achieve a desired smoothness of the surface of the dielectric.

* * * * *